(12) United States Patent
Sun et al.

(10) Patent No.: US 10,338,171 B2
(45) Date of Patent: Jul. 2, 2019

(54) GENERATING GRADIENT SIGNAL

(71) Applicant: SHENYANG NEUSOFT MEDICAL SYSTEMS CO., LTD., Shenyang (CN)

(72) Inventors: Rong Sun, Shenyang (CN); Yan Wang, Shenyang (CN); Hongwei Wang, Shenyang (CN)

(73) Assignee: Shenyang Neusoft Medical Systems Co., Ltd., Shenyang (CN)

( * ) Notice: Subject to any disclaimer, the term of this patent is extended or adjusted under 35 U.S.C. 154(b) by 148 days.

(21) Appl. No.: 15/711,860

(22) Filed: Sep. 21, 2017

(65) Prior Publication Data

US 2018/0088194 A1    Mar. 29, 2018

(30) Foreign Application Priority Data

Sep. 23, 2016  (CN) .......................... 2016 1 0847310

(51) Int. Cl.
| | | |
|---|---|---|
| *G01R 33/022* | (2006.01) | |
| *G01R 33/3815* | (2006.01) | |
| *G01R 33/36* | (2006.01) | |
| *G01R 33/385* | (2006.01) | |
| *G01R 33/54* | (2006.01) | |
| *G01R 33/56* | (2006.01) | |

(52) U.S. Cl.
CPC ....... *G01R 33/3815* (2013.01); *G01R 33/022* (2013.01); *G01R 33/3607* (2013.01); *G01R 33/3852* (2013.01); *G01R 33/3854* (2013.01); *G01R 33/543* (2013.01); *G01R 33/5608* (2013.01)

(58) Field of Classification Search
CPC ................ G01R 33/022; G01R 33/543; G01R 33/3815; G01R 33/3852; G01R 33/3854; G01R 33/3607; G01R 33/5608; A61B 5/0033; A61B 5/062; A61B 5/0422; A61B 5/044

See application file for complete search history.

(56) References Cited

U.S. PATENT DOCUMENTS

| | | | | |
|---|---|---|---|---|
| 6,392,408 B1 * | 5/2002 | Barrall | ................ | G01R 33/441 324/300 |
| 7,847,550 B2 * | 12/2010 | Diehl | ................ | G01R 33/5659 324/307 |
| 9,897,677 B2 * | 2/2018 | Bhagat | ............... | G01R 33/3692 |

* cited by examiner

*Primary Examiner* — Minh N Tang
(74) *Attorney, Agent, or Firm* — McCoy Russell LLP

(57) ABSTRACT

Methods of generating a gradient signal, gradient signal generators and magnetic resonance imaging systems are provided. In one aspect, a method includes obtaining a target amplitude and a target duration associated with a target precision corresponding to the gradient signal; generating a first actual amplitude by intercepting the target amplitude according to an actual precision of a DAC; generating a second actual amplitude according to the first actual amplitude, wherein a difference between the second actual amplitude and the first actual amplitude is 1; determining a first actual duration of outputting the first actual amplitude and a second actual duration of outputting the second actual amplitude according to the target amplitude, the target duration, the first actual amplitude and the second actual amplitude; controlling the DAC to output the first actual amplitude according to the first actual duration and output the second actual amplitude according to the second actual duration.

15 Claims, 4 Drawing Sheets

GENERATING GRADIENT SIGNAL

CROSS REFERENCE TO RELATED APPLICATIONS

This application claims priority to Chinese Patent Application No. 201610847310.6 entitled "Method and Apparatus for Outputting Gradient Signal" filed on Sep. 23, 2016, the entire content of which is incorporated herein by reference for all purposes.

TECHNICAL FIELD

The present disclosure relates to magnetic resonance technical fields, and more particularly to generating a gradient signal.

BACKGROUND

Nuclear magnetic resonance is a frequently-used imaging examination technique. A magnetic resonance imaging system can include a radio-frequency transmitting subsystem, a three-dimensional gradient subsystem, a radio-frequency receiving subsystem, and the like. The three-dimensional gradient subsystem can be configured to provide a gradient magnetic field which meets a linearity desire and can be rapidly switched on and off. The gradient magnetic field is superimposed on a main magnetic field so as to implement spatial location for an imaging voxel.

NEUSOFT MEDICAL SYSTEMS CO., LTD. (NMS), founded in 1998 with its world headquarters in China, is a leading supplier of medical equipment, medical IT solutions, and healthcare services. NMS supplies medical equipment with a wide portfolio, including CT, Magnetic Resonance Imaging (MRI), digital X-ray machine, ultrasound, Positron Emission Tomography (PET), Linear Accelerator (LINAC), and biochemistry analyser. Currently, NMS' products are exported to over 60 countries and regions around the globe, serving more than 5,000 renowned customers. NMS's latest successful developments, such as 128 Multi-Slice CT Scanner System, Superconducting MRI, LINAC, and PET products, have led China to become a global high-end medical equipment producer. As an integrated supplier with extensive experience in large medical equipment, NMS has been committed to the study of avoiding secondary potential harm caused by excessive X-ray irradiation to the subject during the CT scanning process.

DETAILED DESCRIPTION

In practical applications, a gradient signal which can be outputted by a Digital to Analog Converter (DAC) may have a low precision, while a precision of a gradient signal which a magnetic resonance imaging system demands a gradient system to output may be high. Thus, a DAC which can output a gradient signal with a target precision may be used. However, a cost for the DAC with the high output precision is high.

In view of above, a method of generating a gradient signal is provided according to an example of the present disclosure, so as to implement that a gradient signal with a high precision can be outputted by using a DAC with a low precision.

Figure 1:
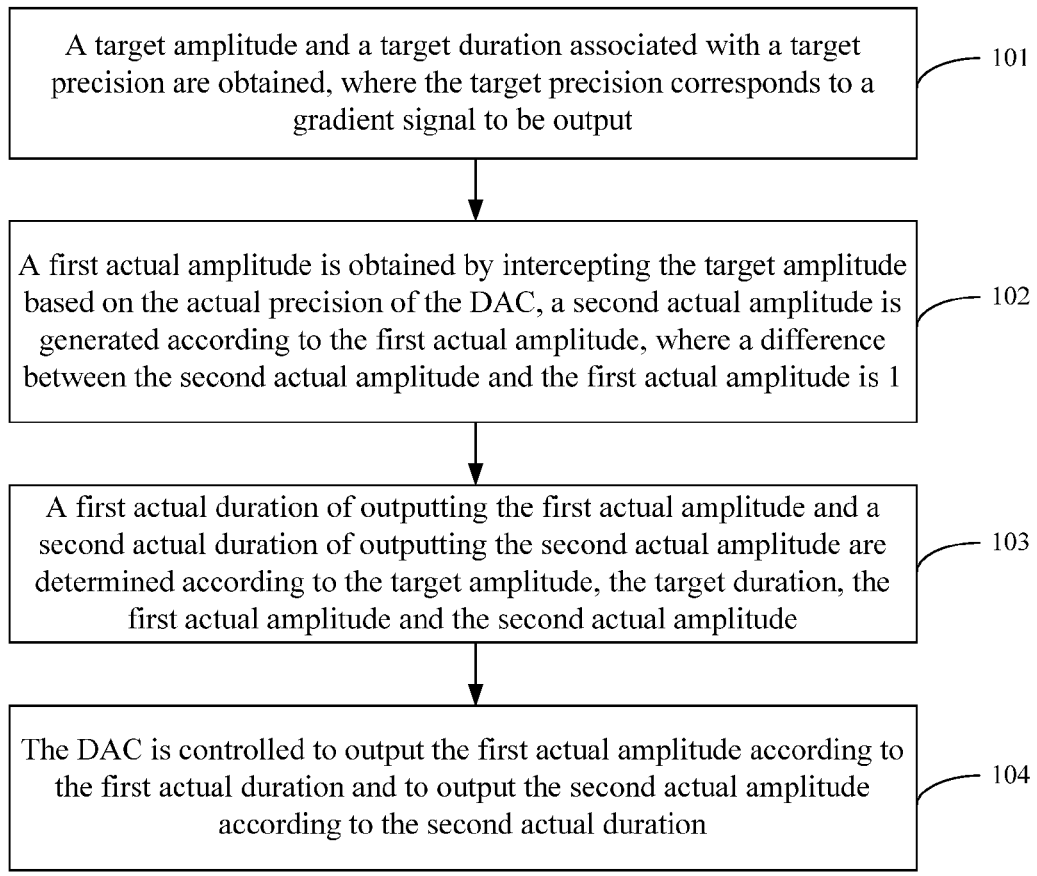
FIG. 1 is a flowchart illustrating a method of generating a gradient signal according to an example of the present disclosure.

FIG. 1 is a flowchart illustrating a method of generating a gradient signal according to an example of the present disclosure. As shown in FIG. 1, the method includes procedures as follows.

At block 101, a target amplitude and a target duration associated with a target precision are obtained, where the target precision corresponds to a gradient signal to be output.

A precision of a gradient signal which can be outputted by a DAC is an actual precision, and a precision of a gradient signal desired in a practical application is a target precision, where the target precision may be higher than the actual precision. For example, the actual precision of the DAC is 20 bits, while the target precision of the desired gradient signal is 24 bits.

A size of a gradient signal outputted by the DAC is expressed by an amplitude of the gradient signal and a duration of outputting the amplitude. That is, the size of the gradient signal is equal to product of the amplitude and the duration of outputting the amplitude. Thus, the target duration is a duration of outputting the target amplitude.

The actual precision of the DAC may be smaller than the target precision. For example, it is assumed that the precision of the gradient signal desired to be output is 24 bits, thus, the target precision is 24 bits, while the actual precision, e.g., 20 bits, is smaller than 24 bits.

At block 102, a first actual amplitude is obtained by intercepting the target amplitude based on the actual precision of the DAC. The actual precision available to be outputted by the DAC is low, and the target precision is high. The target amplitude is intercepted based on the actual precision of the DAC. An upper-bit numerical value which corresponds to the number of bits of the actual precision available to be outputted by the DAC is retained in the target amplitude, and a lower-bit numerical value exceeding the actual precision is rejected from the target amplitude, so as to obtain the first actual amplitude. In this case, the precision of the first actual amplitude may be regarded as the actual precision. And a second actual amplitude is generated according to the first actual amplitude, where a difference between the second actual amplitude and the first actual amplitude may be 1. However, the difference between the second and first actual amplitudes may be less than or greater than 1 without departing from the scope of the present disclosure.

For example, it is assumed that the target precision is 24 bits and the actual precision of the DAC is 20 bits. The target amplitude is intercepted. An upper 20 bits numerical value of the target amplitude is retained, and a lower 4 bits numerical value of the target amplitude is rejected. For example, the target amplitude is 0000 0000 0000 0000 0100 0011, and the target precision is 24 bits. According to the 20 bits actual precision of the DAC, the target amplitude is intercepted by just retaining the upper 20 bits numerical value to obtain the first actual amplitude 0000 0000 0000 0000 0100, and rejecting the lower 4 bits numerical value, i.e., 0011.

It should to be noted that in an example of the present disclosure, an amplitude, a target amplitude, a first actual amplitude and a second actual amplitude may be regarded as analog values outputted by a DAC. However, DACs with a same precision but made by different manufactures may have different output voltage ranges. For example, the output voltage ranges of the DACs with the precision of 20 bits may include 0 to 5V, 0 to 10V, etc. To make the method in examples of the present disclosure apply to DACs with different output voltage ranges, an amplitude may be expressed as a digital value with the number of valid bits corresponding to a precision value, i.e., the input digital value. For example, when the target precision is 24 bits, the target amplitude is expressed as a value in a range from 0000 0000 0000 0000 0000 0000 to 1111 1111 1111 1111 1111 1111, such as 0000 0000 0000 0000 0100 0011. That is because an input digital value range for a DAC can be fixed. For example, an input digital value range for each DAC with the precision of 20 bits is 0000 0000 0000 0000 to 1111 1111 1111 1111, further an input digital value has a linearly proportional relationship with an output analog value.

It can be seen that, the first actual amplitude is an upper bits numerical value with the number of bits corresponding to the actual precision in the target amplitude, and the precision of the first actual amplitude is the actual precision. The DAC can directly output the first actual amplitude.

At block 103, a first actual duration of outputting the first actual amplitude and a second actual duration of outputting the second actual amplitude are determined according to the target amplitude, the target duration, the first actual amplitude and the second actual amplitude.

The target amplitude is intercepted according to the actual precision to obtain the first actual amplitude. A rejected lower bit numerical value from the first actual amplitude corresponds to a decimal of the first actual amplitude, i.e., the rejected lower bit numerical value may be less than 1. It may be determined that the second actual amplitude is the first actual amplitude plus 1. In this case, the target amplitude is larger than the first actual amplitude and smaller than the second actual amplitude, where a difference between the target amplitude and the first actual amplitude is less than 1, and a difference between the second actual amplitude and the target amplitude is also less than 1.

In an example, the process of determining the first actual duration of outputting the first actual amplitude and the second actual duration of outputting the second actual amplitude according to the target amplitude, the target duration, the first actual amplitude and the second actual amplitude may include procedures as follows.

A first equivalent relationship is generated to indicate that a target area is equal to a product of an area sum and a n-th power of 2, where the target area is a product of the target amplitude and the target duration, the area sum is a sum of a first area and a second area, the first area is a product of the first actual amplitude and the first actual duration, a second area is the product of the second actual amplitude and the second duration, and n is a difference between the number of valid bits of the target precision and the number of valid bits of the actual precision.

A second equivalent relationship is generated to at least indicate that the target duration is equal to a sum of the first actual duration and the first actual duration.

The first actual duration and the second actual duration are determined according to the first equivalent relationship and the second equivalent relationship.

The first equivalent relationship may indicate that a size of a gradient signal outputted based on the target precision is same as that of a gradient signal outputted based on the actual precision. The size of the gradient signal outputted based on the target precision is the product of the target amplitude and the target duration. The size of the gradient signal outputted based on the actual precision is a sum of a first product value and a second product, where the first product value is the product of the first actual amplitude and the first actual duration, and the second product value is the product of the second actual amplitude and the second actual duration.

The target area is used to express the product of the target amplitude and the target duration, the first area is used to express the product of the first actual amplitude and the first actual duration, and the second area is used to express the product of the second actual amplitude and the second actual duration. Thus, when the target precision is reached, the sum of the first area and the second area is equal to the target area. Since the first area and the second area are calculated according to the actual precision, the area sum calculated based on the actual precision may be converted into an area sum based on the target precision according to a difference n between the number of the valid bits of the target precision and the number of the valid bits of the actual precision. For example, when the target precision is 24 bits and the actual precision of the DAC is 20 bits, n is 4.

For example, when the target precision is 24 bits and the actual precision of the DAC is 20 bits, n is equal to 4.

The first equivalent relationship may be expressed by formula (1):

$$[BT_1+(B+1)T_2]2^n=AT \quad (1)$$

where B is the first actual amplitude; (B+1) is the second actual amplitude; $T_1$ is the first actual duration; $T_2$ is the second actual duration; A is the target amplitude; T is the target duration; n is the difference between the number of valid bits of the target precision and the number of valid bits of the actual precision.

The second equivalent relationship may indicate that the duration of outputting a gradient signal based on the target precision is same as the duration of outputting a gradient signal based on the actual precision, which may be expressed by formula (2):

$$T_1+T_2=T \quad (2)$$

The first actual duration and the second actual duration may be determined according to the first equivalent relationship and the second equivalent relationship. For example, the formulas (3) and (4) are derived according to the formula (1) and the formula (2) to calculate $T_1$ and $T_2$.

The formula (3) is used to calculate the first actual duration:

$$T_1 = \left(B + 1 - \frac{A}{2^n}\right)T \quad (3)$$

The formula (4) is used to calculate the second actual duration:

$$T_2 = \left(\frac{A}{2^n} - B\right)T \quad (4)$$

At block 104, the DAC is controlled to output the first actual amplitude according to the first actual duration and to output the second actual amplitude according to the second actual duration.

In an example, the DAC is controlled to output the gradient signal with the target precision according to the first actual duration of outputting the first actual amplitude and the second actual duration of outputting the second actual amplitude.

After the first actual duration of outputting the first actual amplitude and the second actual duration of outputting the second actual amplitude are determined, an output of the DAC with the actual precision may be controlled accordingly in a way that it can be implemented to equivalently generate a gradient signal with the target precision.

Figure 2:
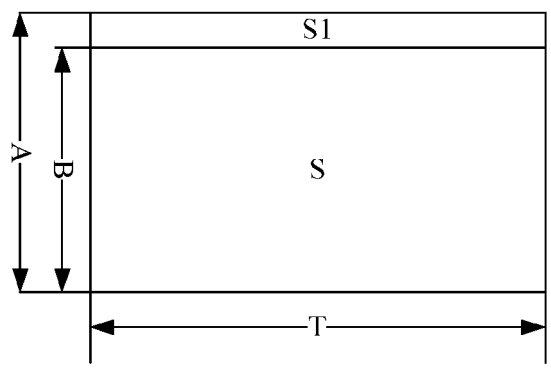
FIG. 2 is a schematic diagram of generating a gradient signal with an actual precision according to an example of the present disclosure.

As shown in FIG. 2, if the DAC with the actual precision directly outputs a gradient signal based on a target amplitude A in a target duration T, the DAC can only output a gradient signal with an actual amplitude B in the target duration T, thus, an error of S1 may be generated between the outputted gradient signal and a gradient signal with the target precision. An area S may correspond to the gradient signal of the actual amplitude B.

Figure 3:
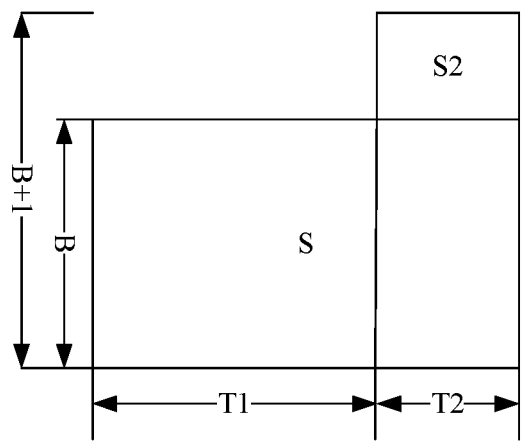
FIG. 3 is a schematic diagram of generating a gradient signal with a target precision according to an example of the present disclosure.

According to a method of generating a gradient signal provided in examples of the present disclosure, as shown in FIG. 3, the DAC with the actual precision performs outputting according to the method above, for example, a gradient signal with the actual amplitude B is outputted in a duration T1 and a gradient signal with the actual amplitude B+1 is outputted in a duration T2, where the actual amplitude B is smaller than the target amplitude A of FIG. 2, and the actual amplitude B+1 is larger than the target amplitude A. An area of S2 in FIG. 3 may be substantially equal to an area of S1 in FIG. 2 in a way that a size of the gradient signal outputted by the DAC is substantially equal to a size of the gradient signal with the target precision. In one example, substantially equal may refer to a value being within 1 to 5% of a target value, where deviations between the value and the target value may be based on manufacturing tolerances.

In an example, as shown in FIG. 3, the process of controlling the DAC to output the first actual amplitude according to the first actual duration and to output the second actual amplitude according to the second actual duration specifically includes procedures as follows.

In the target duration, the first actual amplitude is firstly outputted in the first actual duration, and the second actual amplitude is subsequently in the second actual duration.

The DAC is controlled firstly to output the first actual amplitude in the first actual duration. After the first actual duration ends, the DAC is controlled to output the second actual amplitude in the second actual duration. In this case, there may be almost no time interval between the process of outputting the first actual amplitude and the process of outputting the second actual amplitude.

Figure 4:
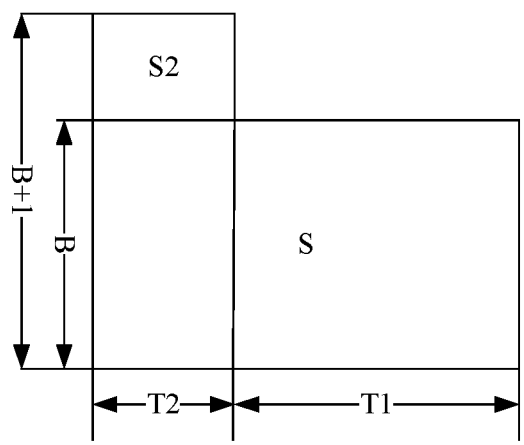
FIG. 4 is a schematic diagram of generating a gradient signal with a target precision according to another example of the present disclosure.

In an example, as shown in FIG. 4, the process of controlling the DAC to output the first actual amplitude according to the first actual duration and to output the second actual amplitude according to the second actual duration specifically includes procedures as follows.

According to a method of generating a gradient signal provided in examples of the present disclosure, as shown in FIG. 4, the DAC with the actual precision performs outputting according to the method above, for example, a gradient signal with the actual amplitude B is outputted in a duration T1 and a gradient signal with the actual amplitude B+1 is outputted in a duration T2, where the actual amplitude B is smaller than the target amplitude A of FIG. 2, and the actual amplitude B+1 is larger than the target amplitude A. An area of S2 in FIG. 4 can be substantially equal to an area of S1 in FIG. 2 in a way that a size of the gradient signal outputted by the DAC is substantially equal to a size of the gradient signal with the target precision. Additionally or alternatively, the area S2 of FIG. 4 may be substantially equal to the area S2 in FIG. 3.

In the target duration, the second actual amplitude is firstly outputted in the second actual duration, and the first actual amplitude is subsequently in the first actual duration.

The DAC is controlled firstly to output the second actual amplitude in the second actual duration, and after the second actual duration ends, the DAC is controlled to output the first actual amplitude in the first actual duration. In this case, there may be almost no time interval between the process of outputting the second actual amplitude and the process of outputting the first actual amplitude.

Figure 5:
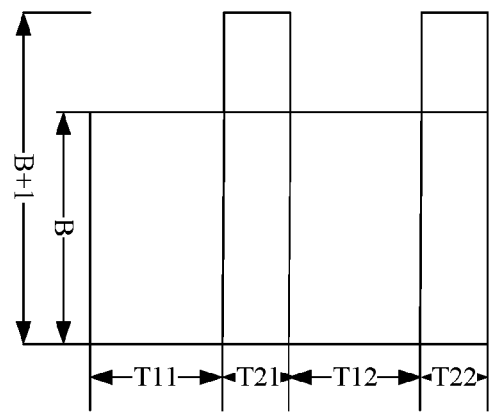
FIG. 5 is a schematic diagram of generating a gradient signal with a target precision according to another example of the present disclosure.

In an example, as shown in FIG. 5, the process of controlling the DAC to output the first actual amplitude according to the first actual duration and to output the second actual amplitude according to the second actual duration specifically includes procedures as follows.

In the target duration, the first actual amplitude and the second actual amplitude are alternately outputted, where a sum of durations of outputting the first actual amplitude is equal to the first actual duration and a sum of durations of outputting the second actual amplitude is equal to the second actual duration.

As shown in FIG. 5, the DAC may be controlled to alternately output the first actual amplitude and the second actual amplitude, where the durations of outputting the first actual amplitude are T11 and T12, and the durations of outputting the second actual amplitude are T21 and T22, a sum of T11 and T12 is equal to the first actual duration, and a sum of T21 and T22 is equal to the second actual duration.

To better understand technical solutions based on examples of the present disclosure, a specific example is given below.

In the example, the target precision is 24 bits, the actual precision of the DAC is 20 bits, where the target amplitude A is 0000 0000 0000 0000 0100 0011 and the target duration is 16 µs. The target amplitude A equal to 0000 0000 0000 0000 0100 0011 is intercepted according to the 20 bits actual precision of the DAC to obtain the first actual amplitude B equal to 0000 0000 0000 0000 0100 and the second actual amplitude (B+1) equal to 0000 0000 0000 0000 0101, where n=4. T1 equal to 13 µs and T2 equal to 3 µs are obtained by performing calculation according to the formula (3) and the formula (4).

Thus, the duration of outputting the first actual amplitude B=0000 0000 0000 0000 0100 by the DAC may be controlled to be 13 µs, and the duration of outputting the second actual amplitude B+1=0000 0000 0000 0000 0101 is controlled to be 3 µs.

An area of a gradient signal outputted based on the 24 bits target precision is:

$AT=1072.$

An area of a gradient signal outputted by the DAC based on the 20 bits actual precision is:

$BT1+(B+1)T2=67.$

The area calculated based on the 20 bits actual precision is converted into an area associated with the 24 bits target precision:

$67 \times 2^4 = 1072.$

Thus, the gradient signal outputted by the DAC based on the 20 bits actual precision is equal to the gradient signal outputted based on the 24 bits target precision.

Further, Table 1 shows an output manner that gradient signal with the 24 bits target precision is outputted by the DAC with the 20 bits actual precision in 16 μs.

TABLE 1

| Lower 4 Bits Value of Target Amplitude with 24 Bits Target Precision | First Actual Duration (μs) | Second Actual Duration (μs) |
|---|---|---|
| 0000 | 16 | 1 |
| 0001 | 15 | 2 |
| 0010 | 14 | 3 |
| 0011 | 13 | 4 |
| 0100 | 12 | 5 |
| 0101 | 11 | 6 |
| 0110 | 10 | 7 |
| 0111 | 9 | 8 |
| 1000 | 8 | 9 |
| 1001 | 7 | 10 |
| 1010 | 6 | 11 |
| 1011 | 5 | 12 |
| 1100 | 4 | 13 |
| 1101 | 3 | 14 |
| 1110 | 2 | 15 |
| 1111 | 1 | 16 |

It can be seen from above, a target amplitude and a target duration time period associated with a target precision corresponding to a gradient signal to be outputted is obtained; a first actual amplitude is obtained by intercepting the target amplitude according to an actual precision of a DAC; a second actual amplitude is obtained according to the first actual amplitude, wherein a difference between the second actual amplitude and the first actual amplitude is 1; a first actual duration of outputting the first actual amplitude and a second actual duration of outputting the second actual amplitude are determined according to the target amplitude, the target duration, the first actual amplitude and the second actual amplitude; and the DAC is controlled to output the first actual amplitude according to the first actual duration and to output the second actual amplitude according to the second actual duration. Thus, a gradient signal with the target precision can be provided, which is larger than the actual precision available to be provided by the DAC, and gradient coding errors can be effectively reduced, spatial locating accuracy can be improved, thereby ensuring a better imaging effect.

Figure 6:
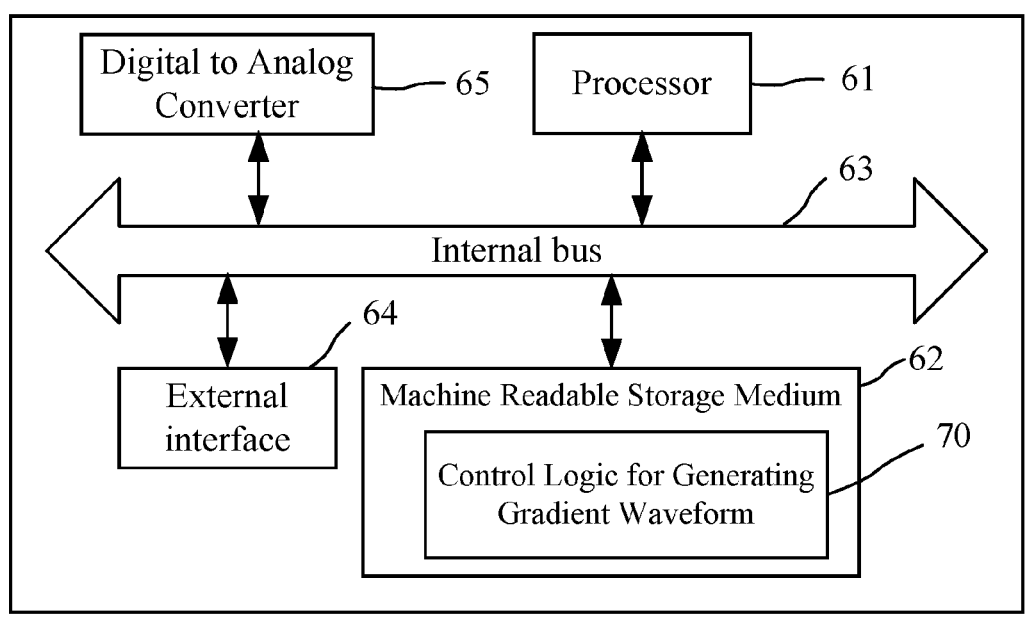
FIG. 6 is a schematic diagram illustrating a hardware structure of a gradient signal generator according to an example of the present disclosure.

As shown in FIG. 6, corresponding to the methods above, the present disclosure further provides a gradient waveform generator. As shown in FIG. 6, the generator includes: a processor 61, a machine readable storage medium 62 and a DAC 65, where the processor 61 and the machine readable storage medium 62 are interconnected via an internal bus 63. In another possible implementing method, the generator may further include an external interface 64 so as to communicate with other devices or components.

In examples, the machine readable storage medium 62 may be: a Read-Only Memory (ROM), a volatile memory, a non-volatile memory, a flash memory, a storage drive (e.g. hard disk drive), a solid state hard disk, any type of storage disk (e.g., optical disk, Digital Video Disk (DVD)), or a similar storage medium, or a combination thereof.

Figure 7:
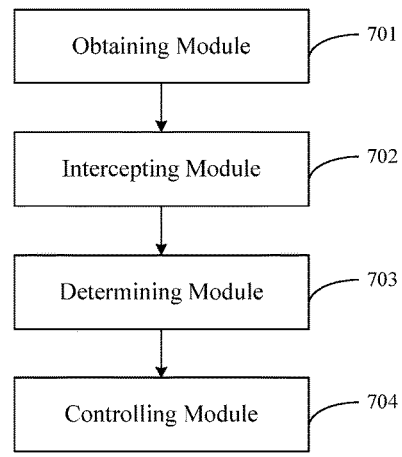
FIG. 7 is a schematic diagram illustrating functional modules of logic for generating a gradient signal according to an example of the present disclosure.

Further, the machine readable storage medium 62 stores the control logic 70 for generating a gradient waveform. As shown in FIG. 7, functionally, the control logic 70 of FIG. 6 includes modules as follows and/or memory stored on memory thereof that when executed enable the control logic 70 to executed the modules below.

An obtaining module 701 may be configured to obtain a target amplitude and a target duration associated with a target precision corresponding to the gradient signal.

An intercepting module 702 may be configured to generate a first actual amplitude by intercepting the target amplitude according to an actual precision of the DAC, generate a second actual amplitude according to the first actual amplitude, wherein a difference between the second actual amplitude and the first actual amplitude is 1.

A determining module 703 may be configured to determine a first actual duration of outputting the first actual amplitude and a second actual duration of outputting the second actual amplitude according to the target amplitude, the target duration, the first actual amplitude and the second actual amplitude; and A controlling module 704 may be configured to control the DAC to output the first actual amplitude according to the first actual duration and to output the second actual amplitude according to the second actual duration.

In an example, the determining module includes sub-modules as follows.

A first generating sub-module may be configured to generate a first equivalent relationship to indicate that a target area is equal to product of an area sum and a n-th power of 2, wherein the target area is product of the target amplitude and the target duration; the area sum is a sum of a first area and a second area; the first area is product of the first actual amplitude and the first actual duration; the second area is product of the second actual amplitude and the second actual duration; n is a difference between the number of valid bits of the target precision and the number of valid bits of the actual precision.

A second generating sub-module may be configured to generate a second equivalent relationship to indicate that the target duration is equal to a sum of the first actual duration and the second actual duration.

A determining sub-module may be configured to determine the first actual duration and the second actual duration according to the first equivalent relationship and the second equivalent relationship.

In an example, the controlling module 704 may be configured to control, in the target duration, the DAC to: firstly output the first actual amplitude in the first actual duration; subsequently output the second actual amplitude in the second actual duration.

In an example, the controlling module 704 may be configured to control, in the target duration, the DAC to: firstly output the second actual amplitude in the second actual duration; subsequently output the first actual amplitude in the first actual duration.

In an example, the controlling module 704 may be configured to control, in the target duration, the DAC to alternately output the first actual amplitude and the second actual amplitude, wherein a sum of durations of outputting the first actual amplitude is equal to the first actual duration, a sum of durations of outputting the second actual amplitude is equal to the second actual duration.

Taking software implementation as an example to further describe how the gradient waveform generator executes the control logic 70. In the example, the control logic 70 may be interpreted as computer instructions stored on the machine readable storage medium 62. When a CPU 61 of the gradient waveform generator in the present disclosure executes the control logic 70, the CPU 61 executes operations as follows by invoking instructions corresponding to the control logic 70 and stored on the machine readable storage medium 62, where the instructions include to obtain a target amplitude and a target duration associated with a target precision corresponding to the gradient signal, generate a first actual amplitude by intercepting the target amplitude according to an actual precision of the DAC, generate a second actual amplitude according to the first actual amplitude, wherein a difference between the second actual amplitude and the first actual amplitude is 1, determine a first actual duration of outputting the first actual amplitude and a second actual duration of outputting the second actual amplitude according to the target amplitude, the target duration, the first actual amplitude and the second actual amplitude, and control the DAC to output the first actual amplitude according to the first actual duration and to output the second actual amplitude according to the second actual duration.

In an example, when determining the first actual duration of outputting the first actual amplitude and the second actual duration of outputting the second actual amplitude according to the target amplitude, the target duration, the first actual amplitude and the second actual amplitude, the processor is caused by the machine-executable instructions corresponding to the control logic and stored on the machine readable storage medium to generate a first equivalent relationship to indicate that a target area is equal to product of an area sum and a n-th power of 2, wherein the target area is product of the target amplitude and the target duration, the area sum is a sum of a first area and a second area, the first area is product of the first actual amplitude and the first actual duration, the second area is product of the second actual amplitude and the second actual duration, n is a difference between the number of valid bits of the target precision and the number of valid bits of the actual precision, generate a second equivalent relationship to indicate that the target duration is equal to a sum of the first actual duration and the second actual duration, and determine the first actual duration and the second actual duration according to the first equivalent relationship and the second equivalent relationship.

In an example, when controlling the DAC to output the first actual amplitude according to the first actual duration and to output the second actual amplitude according to the second actual duration, the processor is caused by the machine-executable instructions corresponding to the control logic and stored on the machine readable storage medium to control, in the target duration, the DAC to firstly output the first actual amplitude in the first actual duration and subsequently output the second actual amplitude in the second actual duration.

In an example, when controlling the DAC to output the first actual amplitude according to the first actual duration and to output the second actual amplitude according to the second actual duration, the processor is caused by the machine-executable instructions corresponding to the control logic and stored on the machine readable storage medium to control, in the target duration, the DAC to firstly output the second actual amplitude in the second actual duration and subsequently output the first actual amplitude in the first actual duration.

In an example, when controlling the DAC to output the first actual amplitude according to the first actual duration and to output the second actual amplitude according to the second actual duration, the processor is caused by the machine-executable instructions corresponding to the control logic and stored on the machine readable storage medium to control, in the target duration, the DAC to alternately output the first actual amplitude and the second actual amplitude, wherein a sum of durations of outputting the first actual amplitude is equal to the first actual duration, and a sum of durations of outputting the second actual amplitude is equal to the second actual duration.

Figure 8:
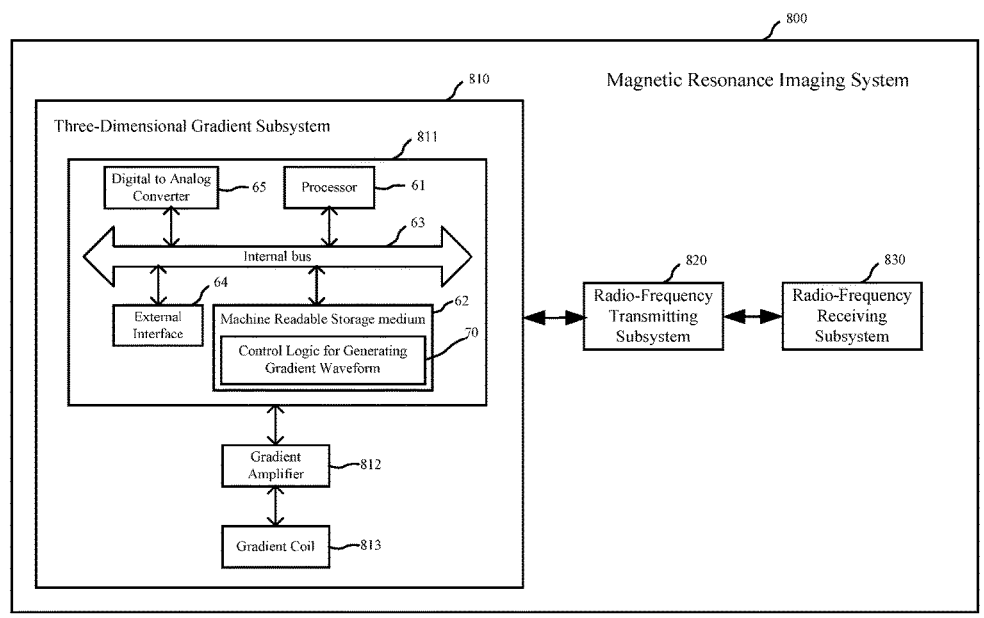
FIG. 8 is a schematic diagram illustrating a magnetic resonance imaging system according to an example of the present disclosure.

Corresponding to the methods above, the present disclosure further provides a nuclear magnetic resonance imaging system. FIG. 8 is a schematic diagram illustrating a structure of a nuclear magnetic resonance imaging system according to an example of the present disclosure. As shown in FIG. 8, the magnetic resonance system 800 includes a three-dimensional gradient subsystem 810, a radio-frequency transmitting subsystem 820, and a radio-frequency receiving subsystem 830.

The three-dimensional gradient subsystem 810 includes a gradient waveform generator 811, a gradient amplifier 812, and a gradient coil 813. The gradient waveform generator 811 is configured to generate three-dimensional gradient pulse signals, where the three-dimensional gradient pulse signals include a slice-selection direction gradient signal, a frequency-coding gradient signal, and a phase-coding gradient signal. The gradient amplifier 812 is configured to amplify the three-dimensional gradient pulse signals. And the gradient coil 813 is configured to generate a three-dimensional gradient magnetic field based on the three-dimensional gradient pulse signals, where the three dimensional gradient magnetic field enables an image to have spatial information.

The gradient waveform generator 811 includes a processor 61, a machine readable storage medium 62 and a DAC 65 as shown in FIG. 6, where the processor 61 and the machine readable storage medium 62 are interconnected via an internal bus 63. In another possible implementing method, the gradient waveform generator 811 may further include an external interface 64 so as to communicate with other devices or components.

The machine readable storage medium 62 stores a control logic 70 for generating a gradient waveform. A manner of executing the control logic 70 by the gradient waveform generator is same as that in the examples above, which is not redundantly described herein.

For simplicity and illustrative purposes, the present disclosure is described by referring mainly to examples thereof. In the above descriptions, numerous specific details are set forth in order to provide a thorough understanding of the present disclosure. It will be readily apparent however, that the present disclosure may be practiced without limitation to these specific details. In other instances, some methods and structures have not been described in detail so as not to unnecessarily obscure the present disclosure. As used herein, the terms "a" and "an" are intended to denote at least one of a particular element, the term "includes" means includes but not limited to, the term "including" means including but not limited to, and the term "based on" means based at least in part on.

The above description is merely preferred examples of the present disclosure and is not intended to limit the present disclosure in any form. Although the present disclosure is disclosed by the above examples, the examples are not intended to limit the present disclosure. Those skilled in the art, without departing from the scope of the technical scheme of the present disclosure, may make a plurality of changes and modifications of the technical scheme of the present disclosure by the method and technical content disclosed above.

Therefore, without departing from the scope of the technical scheme of the present disclosure, based on technical essences of the present disclosure, any simple alterations, equal changes and modifications should fall within the protection scope of the technical scheme of the present disclosure. Accordingly, other embodiments are within the scope of the following claims.

The invention claimed is:

1. A method of generating a gradient signal, comprising:
   obtaining a target amplitude and a target duration associated with a target precision corresponding to the gradient signal;
   generating a first actual amplitude by intercepting the target amplitude according to an actual precision of a digital to analog converter (DAC);
   generating a second actual amplitude according to the first actual amplitude, wherein a difference between the second actual amplitude and the first actual amplitude is 1;
   determining a first actual duration of outputting the first actual amplitude and a second actual duration of outputting the second actual amplitude according to the target amplitude, the target duration, the first actual amplitude and the second actual amplitude; and
   controlling the DAC to output the first actual amplitude according to the first actual duration and to output the second actual amplitude according to the second actual duration.

2. The method of claim 1, wherein determining the first actual duration of outputting the first actual amplitude and the second actual duration of outputting the second actual amplitude according to the target amplitude, the target duration, the first actual amplitude and the second actual amplitude comprises:
   generating a first equivalent relationship to indicate that a target area is equal to a product of an area sum and a n-th power of 2, wherein:
      the target area is a product of the target amplitude and the target duration;
      the area sum is a sum of a first area and a second area;
      the first area is a product of the first actual amplitude and the first actual duration;
      the second area is a product of the second actual amplitude and the second actual duration;
      n is a difference between the number of valid bits of the target precision and the number of valid bits of the actual precision;
   generating a second equivalent relationship to indicate that the target duration is equal to a sum of the first actual duration and the second actual duration;
   determining the first actual duration and the second actual duration according to the first equivalent relationship and the second equivalent relationship.

3. The method of claim 1, wherein controlling the DAC to output the first actual amplitude according to the first actual duration and to output the second actual amplitude according to the second actual duration comprises:
   controlling, in the target duration, the DAC to:
   firstly outputting the first actual amplitude in the first actual duration;
   subsequently outputting the second actual amplitude in the second actual duration.

4. The method of claim 1, wherein controlling the DAC to output the first actual amplitude according to the first actual duration and to output the second actual amplitude according to the second actual duration comprises:
   controlling, in the target duration, the DAC to:
   firstly outputting the second actual amplitude in the second actual duration;
   subsequently outputting the first actual amplitude in the first actual duration.

5. The method of claim 1, wherein controlling the DAC to output the first actual amplitude according to the first actual duration and to output the second actual amplitude according to the second actual duration comprises:
   controlling, in the target duration, the DAC to alternately output the first actual amplitude and the second actual amplitude, wherein
      a sum of durations of outputting the first actual amplitude is equal to the first actual duration,
      a sum of durations of outputting the second actual amplitude is equal to the second actual duration.

6. A gradient signal generator, comprising:
   a Digital to Analog Converter (DAC),
   a processor,
   a non-transitory machine-readable storage medium storing machine executable instructions which are executable by the processor to:
      obtain a target amplitude and a target duration associated with a target precision corresponding to the gradient signal;
      generate a first actual amplitude by intercepting the target amplitude according to an actual precision of the DAC;
      generate a second actual amplitude according to the first actual amplitude, wherein a difference between the second actual amplitude and the first actual amplitude is 1;
      determine a first actual duration of outputting the first actual amplitude and a second actual duration of outputting the second actual amplitude according to the target amplitude, the target duration, the first actual amplitude and the second actual amplitude; and
      control the DAC to output the first actual amplitude according to the first actual duration and to output the second actual amplitude according to the second actual duration.

7. The generator of claim 6, wherein the processor is caused by the machine-executable instructions to:
   generate a first equivalent relationship to indicate that a target area is equal to a product of an area sum and a n-th power of 2, wherein:
      the target area is a product of the target amplitude and the target duration;
      the area sum is a sum of a first area and a second area;
      the first area is a product of the first actual amplitude and the first actual duration;
      the second area is a product of the second actual amplitude and the second actual duration;
      n is a difference between the number of valid bits of the target precision and the number of valid bits of the actual precision;

generate a second equivalent relationship to indicate that the target duration is equal to a sum of the first actual duration and the second actual duration;

determine the first actual duration and the second actual duration according to the first equivalent relationship and the second equivalent relationship.

8. The generator of claim 6, wherein the processor is caused by the machine-executable instructions to:
control, in the target duration, the DAC to:
firstly output the first actual amplitude in the first actual duration;
subsequently output the second actual amplitude in the second actual duration.

9. The generator of claim 6, wherein the processor is caused by the machine-executable instructions to:
control, in the target duration, the DAC to:
firstly output the second actual amplitude in the second actual duration;
subsequently output the first actual amplitude in the first actual duration.

10. The generator of claim 6, wherein the processor is caused by the machine-executable instructions to:
control, in the target duration, the DAC to alternately output the first actual amplitude and the second actual amplitude, wherein
a sum of durations of outputting the first actual amplitude is equal to the first actual duration,
a sum of durations of outputting the second actual amplitude is equal to the second actual duration.

11. A magnetic resonance imaging system, comprising a three-dimensional gradient subsystem configured to provide a gradient magnetic field, wherein
the three-dimensional gradient subsystem comprises a gradient waveform generator,
the gradient waveform generator comprises:
a Digital to Analog Converter (DAC),
a processor,
a non-transitory machine-readable storage medium storing machine executable instructions which are executable by the processor to:
obtain a target amplitude and a target duration associated with a target precision corresponding to the gradient signal;
generate a first actual amplitude by intercepting the target amplitude according to an actual precision of the DAC;
generate a second actual amplitude according to the first actual amplitude, wherein a difference between the second actual amplitude and the first actual amplitude is 1;
determine a first actual duration of outputting the first actual amplitude and a second actual duration of outputting the second actual amplitude according to the target amplitude, the target duration, the first actual amplitude and the second actual amplitude; and
control the DAC to output the first actual amplitude according to the first actual duration and to output the second actual amplitude according to the second actual duration.

12. The system of claim 11, wherein the processor is caused by the machine-executable instructions to:
generate a first equivalent relationship to indicate that a target area is equal to product of an area sum and a n-th power of 2, wherein:
the target area is a product of the target amplitude and the target duration;
the area sum is a sum of a first area and a second area;
the first area is a product of the first actual amplitude and the first actual duration;
the second area is a product of the second actual amplitude and the second actual duration;
n is a difference between the number of valid bits of the target precision and the number of valid bits of the actual precision;
generate a second equivalent relationship to indicate that the target duration is equal to a sum of the first actual duration and the second actual duration;
determine the first actual duration and the second actual duration according to the first equivalent relationship and the second equivalent relationship.

13. The system of claim 11, wherein the processor is caused by the machine-executable instructions to:
control, in the target duration, the DAC to:
firstly output the first actual amplitude in the first actual duration;
subsequently output the second actual amplitude in the second actual duration.

14. The system of claim 11, wherein the processor is caused by the machine-executable instructions to:
control, in the target duration, the DAC to:
firstly output the second actual amplitude in the second actual duration;
subsequently output the first actual amplitude in the first actual duration.

15. The system of claim 11, wherein the processor is caused by the machine-executable instructions to:
control, in the target duration, the DAC to alternately output the first actual amplitude and the second actual amplitude, wherein
a sum of durations of outputting the first actual amplitude is equal to the first actual duration,
a sum of durations of outputting the second actual amplitude is equal to the second actual duration.

* * * * *